(12) United States Patent
Eid et al.

(10) Patent No.: US 11,289,431 B2
(45) Date of Patent: Mar. 29, 2022

(54) ELECTROSTATIC DISCHARGE PROTECTION IN INTEGRATED CIRCUITS USING MATERIALS WITH OPTICALLY CONTROLLED ELECTRICAL CONDUCTIVITY

(71) Applicant: Intel Corporation, Santa Clara, CA (US)

(72) Inventors: Feras Eid, Chandler, AZ (US); Veronica Aleman Strong, Hillsboro, OR (US); Aleksandar Aleksov, Chandler, AZ (US); Adel A. Elsherbini, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 144 days.

(21) Appl. No.: 16/728,127

(22) Filed: Dec. 27, 2019

(65) Prior Publication Data
US 2021/0202403 A1 Jul. 1, 2021

(51) Int. Cl.
*H01L 23/495* (2006.01)
*H01L 23/60* (2006.01)
*H01L 23/498* (2006.01)
*H01L 25/16* (2006.01)
(Continued)

(52) U.S. Cl.
CPC ........ *H01L 23/60* (2013.01); *H01L 23/49816* (2013.01); *H01L 23/49822* (2013.01); *H01L 23/49838* (2013.01); *H01L 23/49894* (2013.01); *H01L 23/5383* (2013.01); *H01L 23/5386* (2013.01); *H01L 25/0652* (2013.01); *H01L 25/0655* (2013.01); *H01L 25/16* (2013.01); *H01L 2224/16148* (2013.01); *H01L 2224/16227* (2013.01); *H01L 2924/30205* (2013.01)

(58) Field of Classification Search
CPC ... H01L 23/60; H01L 23/62; H01L 23/49894; H01L 23/5386; H01L 23/49822; H01L 2924/302; H01L 2924/36
USPC .................................................. 257/660, 668
See application file for complete search history.

(56) References Cited

U.S. PATENT DOCUMENTS 5,490,324 A * 2/1996 Newman ............. H01L 23/3128
174/534
5,581,122 A * 12/1996 Chao ................. H01L 23/49816
257/691
(Continued)

OTHER PUBLICATIONS

Kalachyova, "Reversible switching of PEDOT:PSS conductivity in the dielectric—conductive range through the redistribution of light-governing polymers", RSC Adv. 2018, 8, 11198.

*Primary Examiner* — Nitin Parekh
(74) *Attorney, Agent, or Firm* — Patent Capital Group

(57) ABSTRACT

Disclosed herein are structures, devices, and methods for electrostatic discharge protection (ESDP) in integrated circuits (ICs). In some embodiments, an IC component may include: a first conductive structure; a second conductive structure; and a material in contact with the first conductive structure and the second conductive structure, wherein the material has a first electrical conductivity before illumination of the material with optical radiation and a second electrical conductivity, different from the first electrical conductivity, after illumination of the material with optical radiation.

20 Claims, 6 Drawing Sheets

(51) Int. Cl.
*H01L 23/538* (2006.01)
*H01L 25/065* (2006.01)

(56) References Cited

U.S. PATENT DOCUMENTS

| | | | | |
|---|---|---|---|---|
| 5,640,048 | A * | 6/1997 | Selna | H01L 23/3128 257/738 |
| 5,757,078 | A * | 5/1998 | Matsuda | H01L 23/49816 257/737 |
| 6,232,666 | B1 * | 5/2001 | Corisis | H01L 23/49816 257/774 |
| 7,919,849 | B2 * | 4/2011 | Kodama | G02B 6/43 257/698 |
| 9,978,658 | B2 * | 5/2018 | Suthiwongsunthorn | H01L 21/561 |
| 9,978,731 | B1 * | 5/2018 | Kim | H01L 23/66 |
| 2016/0219718 | A1 * | 7/2016 | Bermel | H01L 23/49894 |

* cited by examiner

ELECTROSTATIC DISCHARGE PROTECTION IN INTEGRATED CIRCUITS USING MATERIALS WITH OPTICALLY CONTROLLED ELECTRICAL CONDUCTIVITY

BACKGROUND

At various stages in the manufacture of an integrated circuit (IC) device, the electronic components of the device may be at risk for damage due to electrostatic discharge. Electrostatic forces may accumulate during manufacturing, handling, and testing, and discharge of these forces may cause permanent damage to sensitive circuits.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
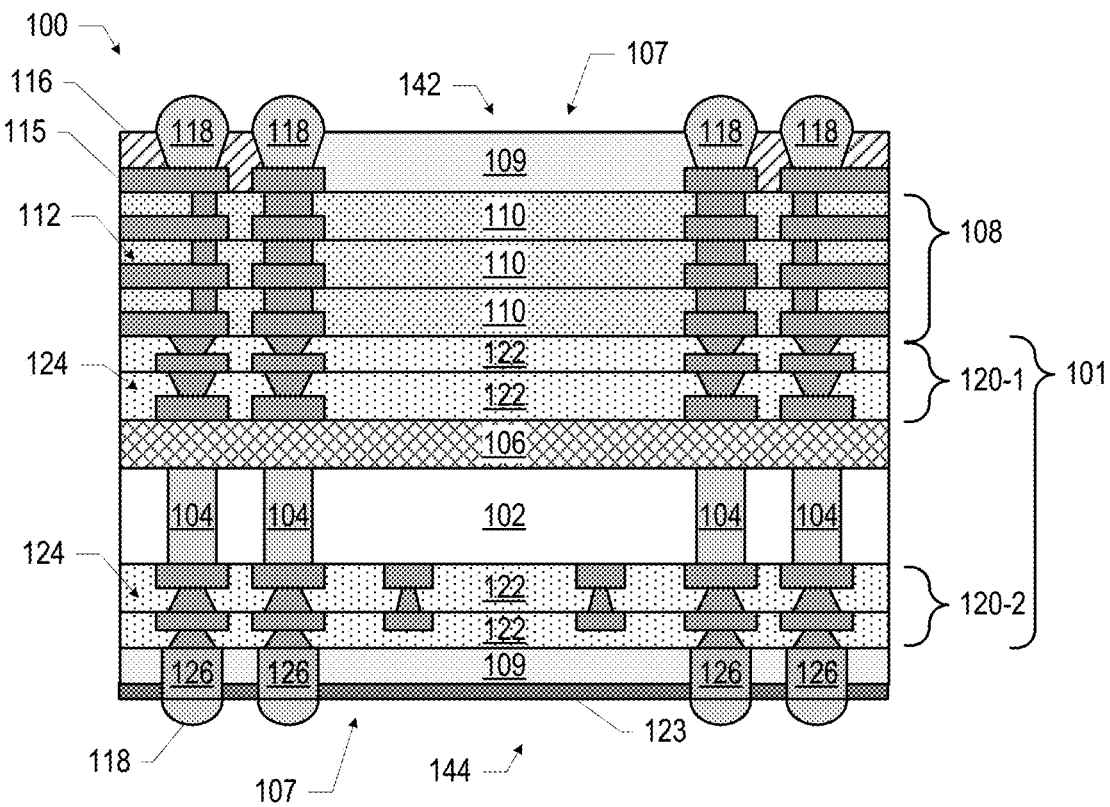
FIGS. 1-6 are side, cross-sectional views of example integrated circuit (IC) structures including electrostatic discharge protection (ESDP) structures, in accordance with various embodiments.

Disclosed herein are structures, devices, and methods for electrostatic discharge protection (ESDP) in integrated circuits (ICs). In some embodiments, an IC component may include: a first conductive structure; a second conductive structure; and a material in contact with the first conductive structure and the second conductive structure, wherein the material has a first electrical conductivity before illumination of the material with optical radiation and a second electrical conductivity, different from the first electrical conductivity, after illumination of the material with optical radiation.

Conventionally, IC devices have been protected from electrostatic discharge by diodes included in the device layer of a die. These diodes have been electrically coupled between exposed locations of the die (e.g., exposed conductive contacts, such as first-level interconnect (FLI) solder bumps) and a ground (e.g., the bulk semiconductor upon which device layers are conventionally fabricated). Such diodes may be designed such that their forward bias voltage is just below the voltage threshold at which the functional devices on the die (e.g., the transistors) may be damaged. When a voltage in the expected operational voltage range is applied at the exposed locations, the diode may act as a capacitor between the exposed location and ground, and any signal received at the exposed location will be transmitted to the functional devices as expected. When an external voltage greater than or equal to this value is applied at the exposed locations, the diode will be forward-biased, shunting the high voltage input to ground and shielding the functional devices.

Continued use of this conventional approach to ESDP, however, becomes more difficult as the size of IC devices continues to shrink. Such on-die diodes may have a large footprint, requiring a significant portion of the valuable "real estate" of the underlying semiconductor material or other substrate. Such diodes may induce capacitive loading and consume leakage power during normal device operation, undesirably increasing the power consumption of such devices and limiting the frequencies at which the devices can operate. Further, conventional diode arrangements may rely on the presence of a bulk semiconductor to serve as the ground, and thus cannot be readily applied in silicon-on-insulator (SOI) or thinned substrate devices.

The ESDP structures and techniques disclosed herein may protect IC devices from electrostatic discharge without occupying expensive on-die real estate and/or without substantially impacting high frequency performance. Further, the ESDP structures and techniques disclosed herein may be readily customized to provide the kind of ESDP that is most advantageous at each of the different structural levels of an electronic device (e.g., with protection against smaller voltages at the die-level, and against greater voltages at the package- or circuit board-level).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y.

FIGS. 1-6 are side, cross-sectional views of example IC structures 100 including electrostatic discharge protection (ESDP) structures 107, in accordance with various embodiments. Although FIGS. 1-6 depict a particular number and arrangement of ESDP structures 107 in various IC structures 100, these numbers and arrangements are simply illustrative, and any of the IC structures 100 of FIGS. 1-6 may include any desired number and arrangement of ESDP structures 107. Further, the ESDP structures 107 included in an IC structure 100 (or in an IC package support 168, as discussed further below) may take any suitable form (e.g., any of the forms discussed herein).

Figure 2:
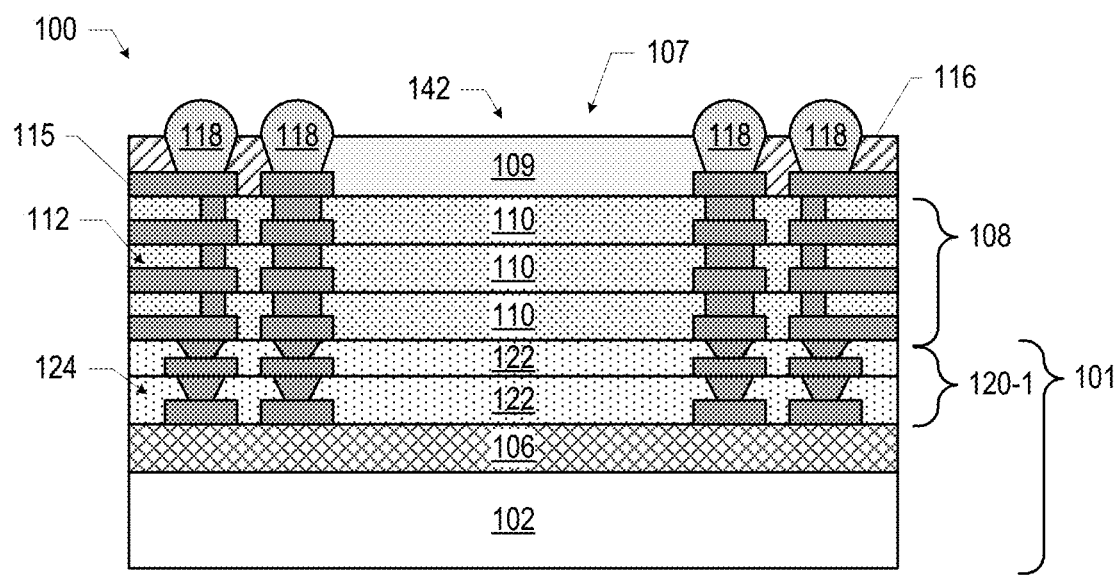
Figure 3:
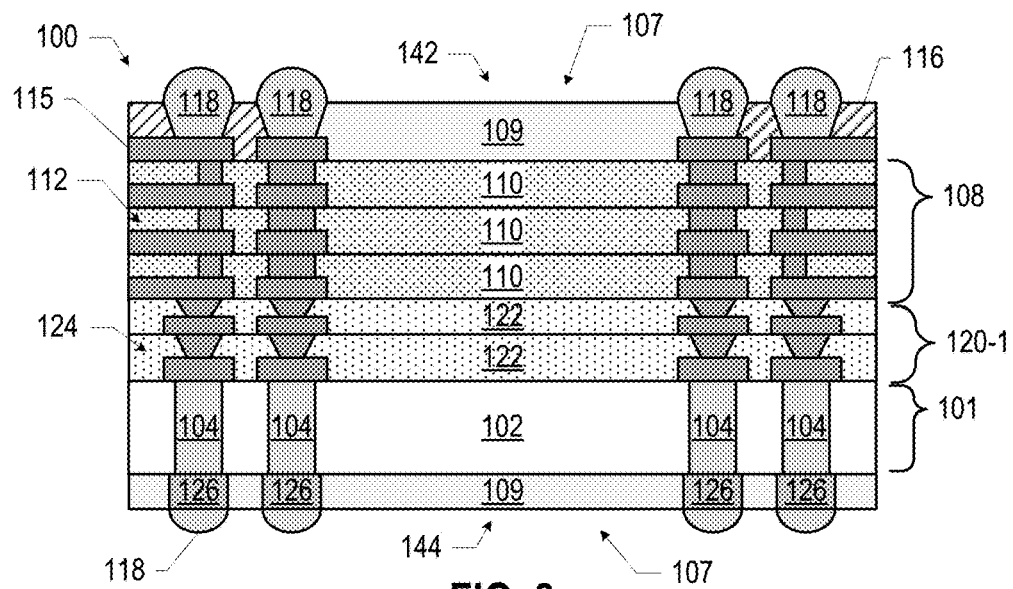
Figure 4:
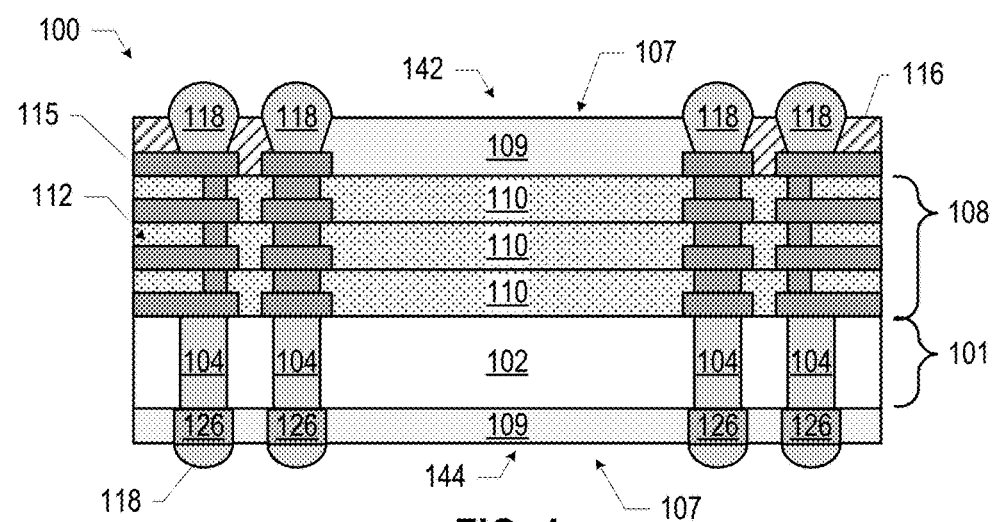
Figure 5:
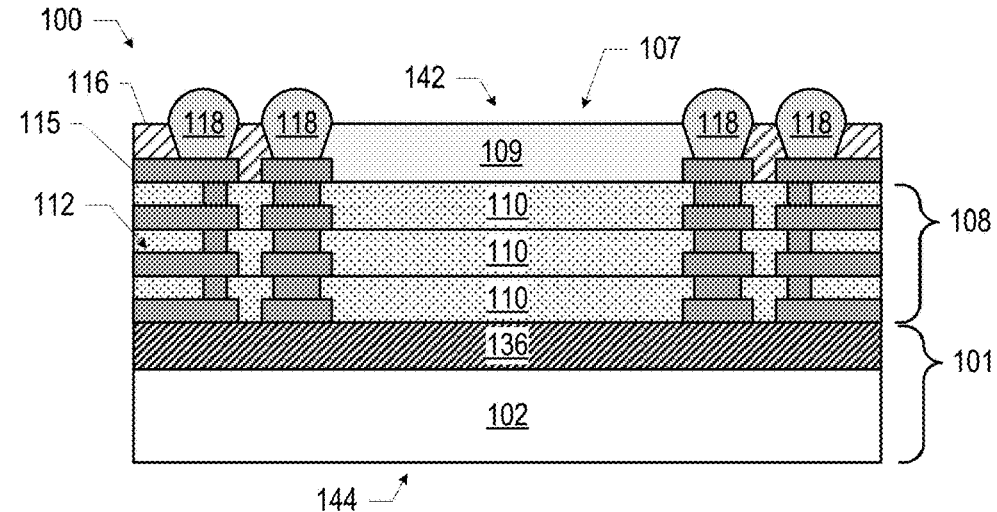

In some embodiments, an IC structure 100 may include a die 101 with redistribution layers (RDLs) 108. A die 101 may include a substrate 102, and may, in some embodiments, include one or more device layers 106 and/or one or more interconnect layers 120. For example, in the embodiment illustrated in FIG. 1, the die 101 includes a device layer 106 proximate to one face (e.g., the "frontside") of the substrate 102, interconnect layers 120-1 proximate to that same face of the substrate 102 (such that the device layer 106 is between the interconnect layers 120-1 and the substrate 102), and RDLs 108 on the interconnect layers 120-1 (such that the interconnect layers 120-1 are between the RDLs 108 and the device layer 106). Further, in the embodiment illustrated in FIG. 1, the die 101 includes interconnect layers 120-2 proximate to the opposite face (e.g., the "backside") of the substrate 102 as the interconnect layers 120-1. In other embodiments, the device layer(s) 106 and/or the interconnect layer(s) 120 may be omitted; for example, FIGS. 3-5 illustrate IC structures 100 in which no device layer 106 is present, and FIGS. 4-5 illustrate IC structures 100 in which no interconnect layers 120 are present. In some embodiments, an IC structure 100 may include one or more device layers 106 and one or more frontside interconnect layers 120 without including any backside interconnect layers 120 (e.g., as illustrated in FIGS. 2-6). Some embodiments (not illustrated) of the IC structure 100 may include no device layers 106 but may include one or more frontside interconnect layers 120 and/or one or more backside interconnect layers 120. More generally, a die 101 including any desired combination of device layer(s) 106 and frontside and/or backside interconnect layers 120 may be used in an IC structure 100.

The substrate 102 may include any suitable material (e.g., an inorganic material). In some embodiments, the substrate 102 may be a semiconductor substrate composed of semiconductor material systems including, for example, n-type or p-type materials systems (or a combination of both). The substrate 102 may include, for example, a crystalline substrate formed using a bulk silicon or a SOI substructure. In some embodiments, the substrate 102 may be formed using alternative materials, which may or may not be combined with silicon, that include but are not limited to germanium, indium antimonide, lead telluride, indium arsenide, indium phosphide, gallium nitride, gallium arsenide, or gallium antimonide. Further materials classified as group II-VI, III-V, or IV may also be included in the substrate 102. In some embodiments, the substrate 102 may include glass, diamond, sapphire, or a ceramic material. In some embodiments, the substrate 102 may advantageously include glass or silicon. As discussed further below, the substrate 102 may be part of a singulated die (e.g., the dies 1502 of FIG. 13) or a wafer (e.g., the wafer 1500 of FIG. 13).

Through-substrate vias (TSVs) 104 may extend through the substrate 102, providing electrical pathways across the substrate 102. The TSVs 104 may include an electrically conductive material (e.g., a metal) and may make contact with electrically conductive structures at opposite faces of the substrate 102. In some embodiments, no TSVs 104 may be present (e.g., as discussed below with reference to FIGS. 2, 5, and 6).

When present in a die 101, a device layer 106 may include one or more transistors (e.g., metal oxide semiconductor field-effect transistors (MOSFETs)), one or more diodes (e.g., for ESDP, as discussed above), or other suitable devices. For example, a device layer 106 may include transistors having source and/or drain (S/D) regions, a gate to control current flow in the transistors between the S/D regions, and one or more S/D contacts to route electrical signals to/from the S/D regions. The transistors may further include additional features, such as device isolation regions, gate contacts, and the like. The transistors in a device layer 106 may include any desired type of transistors, such as planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

The gate of a transistor in a device layer 106 may include at least two layers: a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions may be proximate to the gate of each transistor. The S/D regions may be formed using an implantation/diffusion process or an etching/deposition process, for example. In the former process, dopants such as boron, aluminum, antimony, phosphorous, or arsenic may be ion-implanted into a substrate to form the S/D regions. An annealing process that activates the dopants and causes them to diffuse farther into the substrate may follow the ion-implantation process. In the latter process, a substrate may first be etched to form recesses at the locations of the S/D regions. An epitaxial deposition process may then be carried out to fill the recesses with material that is used to fabricate the S/D regions. In some implementations, the S/D regions may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions may be formed using one or more alternate semiconductor materials such as germanium or a group III-V material or alloy. In further embodiments, one or more layers of metal and/or metal alloys may be used to form the S/D regions.

As noted above, in some embodiments, an IC structure 100 may include frontside interconnect layers 120-1 and/or backside interconnect layers 120-2. Electrical signals, such as power and/or input/output (I/O) signals, may be routed to and/or from the devices (e.g., the transistors and/or diodes) of the device layer 106, or otherwise to and/or from the die 101, through these interconnect layers 120. For example, electrically conductive features of the device layer 106 (e.g., gate and S/D contacts, or diode contacts) may be electrically coupled to electrical pathways 124 through the interconnect layers 120. A set of interconnect layers 120 may also be referred to as a metallization stack.

Conductive lines and/or vias may be arranged within the interconnect layers 120 to route electrical signals along electrical pathways 124 according to a wide variety of designs. In particular, the arrangement is not limited to the particular configuration of conductive lines and vias depicted in FIG. 1 or any of the other accompanying drawings.

Lines and vias in the interconnect layers 120 may include an electrically conductive material such as a metal. The lines may be arranged to route electrical signals in a direction of a plane that is substantially parallel with a surface of the substrate 102. For example, the lines may route electrical signals in a direction in and out of the page from the perspective of FIG. 1. The vias may be arranged to route electrical signals in a direction of a plane that is substantially perpendicular to the surface of the substrate 102. In some embodiments, the vias may electrically couple lines of different interconnect layers 120 together.

The interconnect layers 120 may include a dielectric material 122 disposed between the lines and vias, as shown in FIG. 1. In some embodiments, the dielectric material 122 may be an inorganic dielectric material, such as silicon oxide. In some embodiments, the dielectric material 122 disposed between the lines and vias in different ones of the interconnect layers 120 may have different compositions (e.g., may be different inorganic dielectric materials); in other embodiments, the composition of the dielectric material 122 of different interconnect layers 120 may be the same.

Although the lines and the vias of the interconnect layers 120 are structurally delineated with a line within each interconnect layer 120 for the sake of clarity, the lines and the vias may be structurally and/or materially contiguous (e.g., simultaneously filled during a dual-damascene process) in some embodiments. In some embodiments, the thickness of the individual interconnect layers 120 may increase with the distance from the substrate 102 (e.g., the frontside interconnect layers 120-1 may increase in thickness closer to the front face 142, and the backside interconnect layers 120-2 may increase in thickness closer to the back face 144).

RDLs 108 may be disposed at a face of the die 101. The RDLs 108 may include a dielectric material 110 and electrical pathways 112 through the dielectric material 110; the electrical pathways 112 may include conductive lines and/or vias embedded in the dielectric material 110, and vias may electrically couple lines in different ones of the RDLs 108, as discussed above with reference to the interconnect layers 120. In some embodiments, the dielectric material 110 may be an organic dielectric material; examples of organic dielectric materials 110 may include organic build-up films (e.g., including an organic matrix with an inorganic particle filler, such as silica-filled epoxies), polyimides with or without filler, benzocyclobutene polymers, or unfilled epoxides. Although a particular number of RDLs 108 (i.e., three) is depicted in FIG. 1 and others of the accompanying drawings, an IC structure 100 may include any desired number of RDLs 108.

The IC structure 100 may include a solder resist material 116 (e.g., polyimide or similar material) and one or more conductive contacts 115 on the RDLs 108. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket). In FIG. 1, the conductive contacts 115 are illustrated as taking the form of bond pads. The conductive contacts 115 may be electrically coupled with the electrical pathways 112 of the RDLs 108 and may route the electrical signals of the device layer 106 and/or other electrical signals (e.g., electrical signals received at the conductive contacts 126) to other external devices. For example, solder 118 may be deposited on the one or more conductive contacts 115 to mechanically and/or electrically couple the IC structure 100 with another component at the front face 142 (e.g., another chip). The IC structure 100 may include additional or alternate structures to route the electrical signals to/from the RDLs 108; for example, the conductive contacts 115 may include other analogous features (e.g., posts) that route the electrical signals to/from external components. In some embodiments, the solder resist material 116 may be photodefinable (and thus may be directly patterned).

In some embodiments, the IC structure 100 may include one or more conductive contacts 126 on the back face 144 of the IC structure 100. In some embodiments, a solder resist material (not shown) may also be present. In FIG. 1, the conductive contacts 126 are illustrated as taking the form of pillars (e.g., copper pillars). The conductive contacts 126 may be electrically coupled with the electrical pathways 124 of the backside interconnect layers 120-2 (when the backside interconnect layers 120-2 are present) or the TSVs 104 (when the backside interconnect layers 120-2 are not present) and may route the electrical signals of the device layer 106 and/or other electrical signals (e.g., electrical signals received at the conductive contacts 115) to other external devices. For example, bumps of solder 118 may be formed on the one or more conductive contacts 126 to mechanically and/or electrically couple the IC structure 100 with another component at the back face 144 (e.g., another chip). The IC structure 100 may include additional or alternate structures to route the electrical signals to/from the back face 144; for example, the conductive contacts 126 may include other analogous features (e.g., bond pads) that route the electrical signals to/from external components.

As noted above, the IC structures 100 may include one or more ESDP structures 107. When a component is handled, transported, or subject to further manufacturing operations, the potential exists for the component to experience voltages far larger than those for which the component was designed; such voltages may arise from electrostatic discharge or other sources, and as noted above, may damage sensitive circuitry in the component. An ESDP structure 107 may be a structure included in a component that may controllably and reversibly cause an electrical short (i.e., a zero or low resistance path) between a signal pathway (including, e.g., I/O ports) and a ground (or supply rail) pathway when the component is not in use, and may controllably and reversibly remove the electrical short between the signal pathway and the ground (or supply rail) pathway during use of the component in order to permit normal function of the component. The ESDP structures 107 disclosed herein, then, may help protect sensitive signal circuitry from large voltages arising from static electricity or handling that may otherwise render the signal circuitry inoperative by shorting signal lines to ground when the component is at risk for such voltages, and may otherwise permit normal operation. During use of the component, ESDP may be provided by diodes or other ESDP components included in a circuit board or elsewhere in the larger electronic device, and thus the protection provided by the ESDP structure 107 may no longer be needed.

The ESDP structures 107 disclosed herein may include a material 109 whose electrical resistance is optically controllable; such a material may be referred to herein as an "optically controllable material" or "OCM." That is, the electrical resistance of an OCM 109 may be changed by illumination of the OCM 109 by optical radiation of a particular frequency or frequencies, and this change in electrical resistance may be maintained in the OCM 109 until a subsequent optical radiation event. The OCM 109 may be used in an ESDP structure 107 to controllably "short" signal and ground structures, as discussed above. For ESDP purposes, two different electrical resistance states of the OCM 109 may be utilized: a "high" electrical resistance state in which the OCM 109 acts as an effective electrical insulator, and a "low" electrical resistance state in which the OCM 109 acts as an effective electrical conductor. The values of electrical resistance corresponding to the high and low states may depend upon the particular setting in which the ESDP structure 107 is employed; a high electrical resistance state of the OCM 109 should provide enough resistance to adequately limit current leakage between the ground and signal structures, and the low electrical resistance state of the OCM 109 should provide enough conductance to allow undesirably high voltages at the signal structures to be effectively grounded. When ESDP protection by an ESDP structure 107 is desired (e.g., during handling or transport), the OCM 109 may be appropriately illuminated in advance so as to cause the OCM 109 to be in its low electrical resistance state, thereby providing an effective short between signal and ground. When ESDP protection by an ESDP structure 107 is no longer desired, the OCM 109 may be appropriately illuminated in advance so as to cause the OCM 109 to be in its high resistance state, thereby isolating signal and ground for normal operation. In some embodiments, an appropriate radiation source or sources for the illumination of an OCM 109 may be included in a test fixture to switch the OCM 109 from a low electrical resistance state to a high electrical resistance state to facilitate testing, and then to switch the OCM 109 from the high electrical resistance state to the low electrical resistance state for subsequent handling. In some embodiments, an appropriate radiation source or sources for the illumination of an OCM 109 may be included in an assembly fixture to switch the OCM 109 in a component from a low electrical resistance state to a high electrical resistance state once other ESDP measures (e.g., diodes or other ESDP structures included in circuit boards or other elements coupled to the component) are in place.

In some embodiments, an OCM 109 may include a polymer material. For example, an OCM 109 may include azo-modified poly(3,4-ethylenedioxythiophene) polystyrene sulfonate (PEDOT:PSS). PEDOT:PSS may include two ionomers, sodium polystyrene sulfonate and poly(3,4-ethylenedioxythiophene), and may exhibit reversible photoinduced electrical resistance switching when illuminated by optical beams at different wavelengths. Other OCMs may also be used as an OCM 109. In an ESDP structure 107, the OCM 109 may contact at least one ground conductive structure (including, for example, conductive contacts, conductive pads, conductive vias, conductive lines, or a combination thereof) and at least one signal conductive structure (including, for example, conductive contacts, conductive pads, conductive vias, conductive lines, or a combination thereof). In some embodiments, an ESDP structure 107 may include an OCM 109 at a face of an IC structure 100 (or an IC package support 168, as discussed below), with the OCM 109 in contact with one or more conductive contacts at that face (e.g., the conductive contacts 115 at the front face 142 of the IC structure 100, and/or the conductive contacts 126 at the face 144 of the IC structure 100, or the conductive contacts 184 and/or 186 at the faces 182 and 188, respectively, of an IC package support 168, as discussed below). For example, an OCM 109 may be coplanar with a solder resist material 116, as shown in various ones of the accompanying drawings.

Locating the OCM 109 at a face of a component may enable ready illumination of the OCM 109. Although various ones of the accompanying drawings depict the OCM 109 of an ESDP structure 107 at a "top" or "bottom" face of a component, this is simply illustrative, and in some embodiments, the OCM 109 may bridge ground and signal structures at a side face of a component; such a "side" ESDP structure 107 may be included in any of the IC structures 100 or IC package supports 168 disclosed herein. In some embodiments in which an OCM 109 is located at a face of a component, the OCM 109 may be coated with one or more additional materials through which optical radiation may penetrate; these additional materials may serve as a protective coating on the OCM 109, and/or may impart desired material properties to the component. For example, FIG. 1 illustrates a material coating 123 on the OCM 109 at the face 144 of the IC structure 100; in some embodiments, the material coating 123 may be a hermetic material (e.g., silicon oxide) and thus its use at the face 144 may impart hermeticity to the face 144. A material coating 123 of any desired form may be utilized on an OCM 109 in any of the ESDP structures 107 disclosed herein. In some embodiments, the OCM 109 may be positioned in a component so that when the component is assembled with other components, the OCM 109 is effectively shielded from further radiation. For example, an OCM 109 of an ESDP structure 107 may be included at a face of an IC package support 168 (e.g., a package substrate) so that when a die (or interposer, or other component) is coupled to that face of the IC package support 168, the OCM 109 is located in the shadow of that die and is largely shielded from any subsequent optical radiation that might inadvertently trigger a change in electrical resistance.

As noted above, FIGS. 2-6 illustrate other example embodiments of the IC structure 100. The example IC structures 100 of FIGS. 2-6 depict particular arrangements of ESDP structures 107, but these are simply illustrative, and any desired arrangement (e.g., including a subset of the ESDP structures 107 depicted, or including additional or different embodiments of the ESDP structures 107 disclosed herein) may be used. In FIG. 2, the IC structure 100 includes many of the features of the IC structure 100 of FIG. 1, but does not include TSVs 104, backside interconnect layers 120-2, or backside conductive contacts 126. The IC structure 100 of FIG. 2 may thus be a "single-sided" structure (i.e., with conductive contacts at only one face of the IC structure 100), while the IC structure 100 of FIG. 1 may be a "double-sided" structure (i.e., with conductive contacts at opposing faces of the IC structure 100).

In the IC structures 100 of FIGS. 3-5, no device layer 106 may be present. For example, in FIG. 3, the IC structure 100 includes backside conductive contacts 126 that are in electrical contact with the TSVs 104, which are in electrical contact with the electrical pathways 124 of frontside interconnect layers 120. Some of the electrical pathways 124 may also be in electrical contact with the electrical pathways 112 of the RDLs 108. The IC structure 100 of FIG. 4 is similar to that of FIG. 3, but does not include interconnect layers 120; the backside conductive contacts 126 are in electrical contact with the TSVs 104, which are in electrical contact with the electrical pathways 112 of the RDLs 108.

An IC structure 100 like that of FIG. 4 may be particularly advantageous as an interposer (e.g., an embedded interposer in an organic package substrate) between different dies or other electronic components coupled to the front face 142.

The IC structure 100 of FIG. 5 is similar to that of FIG. 4, but does not include any TSVs 104 and does include a barrier material 136 between the substrate 102 and the RDLs 108. The barrier material 136 may be selected to limit diffusion between the substrate 102 and the dielectric material 110; for example, when the substrate 102 includes silicon, the barrier material 136 may include silicon nitride. An IC structure 100 like that of FIG. 4 may be particularly advantageous as bridge (e.g., an embedded bridge in an organic package substrate) between different dies or other electronic components coupled to the front face 142.

Figure 6:
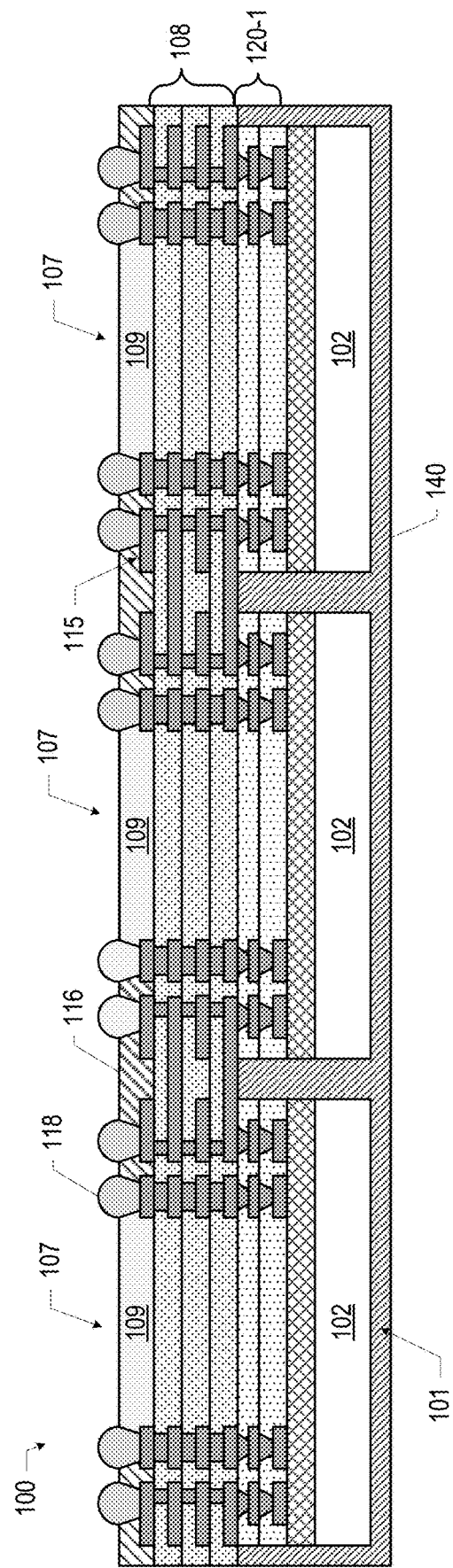

FIG. 6 illustrates a "reconstituted die" embodiment of the IC structure 100. In particular, FIG. 6 illustrates multiple dies 101 electrically coupled by a set of RDLs 108 that span the multiple dies 101. A dielectric material 140 (e.g., a mold compound, silicon dioxide, a spin-on glass, etc.) may be disposed laterally around the dies 101, allowing the IC structure 100 of FIG. 6 to be handled and managed as if it were a single "die."

The ESDP structures 107 disclosed herein may be included in an IC package support 168, instead of or in addition to being included in an IC structure 100. As used herein, an "IC package support" may refer to a component of an IC package that provides mechanical and/or electrical support to other IC devices in the IC package. Examples of IC package supports 168 may include package substrates, interposers, and/or bridges, examples of which are discussed below with reference to FIGS. 8-12. Any of the ESDP structures 107 disclosed herein may be included in an IC package support 168, as desired, including the example arrangement illustrated in FIG. 7.

Figure 7:
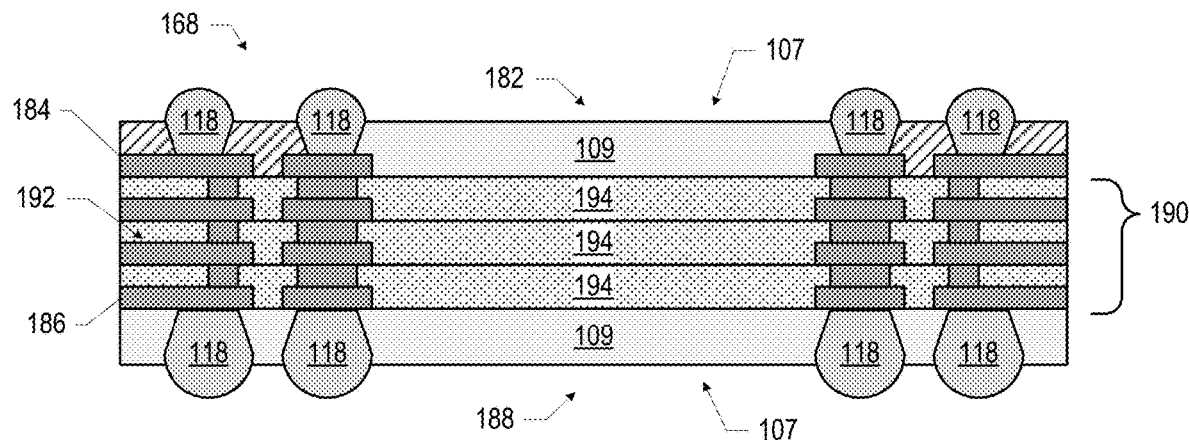
FIG. 7 is a side, cross-sectional view of an example IC package support including ESDP structures, in accordance with various embodiments.

FIG. 7 is a side, cross-sectional view of an example IC package support 168 including one or more ESDP structures 107. The IC package support 168 may include interconnect layers 190 including a dielectric material 194 and electrical pathways 192 through the dielectric material 194; the electrical pathways 192 may include conductive lines and/or vias embedded in the dielectric material 194, and vias may electrically couple lines in different ones of the interconnect layers 190, as discussed above with reference to the RDLs 108. In some embodiments, the dielectric material 194 may be an organic dielectric material; examples of organic dielectric materials may include organic build-up films, or glass-reinforced epoxy laminate material (e.g., a woven fiberglass cloth with an epoxy resin binder). Although a particular number of interconnect layers 190 (i.e., three) is depicted in FIG. 7, an IC package support 168 may include any desired number of interconnect layers 190. In some embodiments, an IC package support 168 may be manufactured using conventional printed circuit board (PCB) techniques. In some embodiments, some or all of the vias and/or lines included in the electrical pathways 192 may be manufactured using a lithographic via technique.

An IC package support 168 may include a solder resist material 116 (e.g., polyimide or similar material) and one or more conductive contacts 184 and 186 at opposing faces 182 and 188, respectively. In some embodiments, the conductive contacts 184 may be FLIs, and the conductive contacts 186 may be second-level interconnects (SLIs). The conductive contacts 186 may be, for example, ball grid array (BGA) or land grid array (LGA) contacts. The conductive contacts 184 and 186 may be electrically coupled with the electrical pathways 192 and may route electrical signals accordingly.

In some embodiments, solder 118 may be deposited on the one or more conductive contacts 184 and 186 to mechanically and/or electrically couple the IC package support 168 with other components (e.g., IC structures 100, circuit boards, etc.).

One or more IC structures 100, and/or one or more IC package supports 168, may be included in an IC assembly 150. FIGS. 8-12 illustrate various examples of IC assemblies 150 including ESDP structures 107, but these particular examples are not exhaustive, and any of the IC structures 100 and/or the IC package supports 168 disclosed herein may be combined with any other suitable components in any other suitable manner to form an IC assembly 150. For example, any of the IC structures 100 and/or IC package supports 168 (or, more generally, any of the ESDP structures 107 disclosed herein) may be included in a cable (e.g., in a cable connector) with the ESDP structures 107 therein providing controllable ESDP in the cable. Although FIGS. 8-12 depict ESDP structures 107 in each element of the IC assemblies 150, this is simply an example, and ESDP structures 107 may be included in some but not all elements of the IC assembly 150. For example, in some embodiments, ESDP structures 107 may be included in the IC structure 100-2 of the IC assembly 150 of FIG. 8, but not in the IC structure 100-1 (or vice versa). In another example, in some embodiments, ESDP structures 107 may be included in the IC package support 168 of the IC assembly 150 of FIG. 9, but not in the IC structure 100 (or vice versa). Further, any of the IC assemblies 150 of any of FIGS. 8-12 may be combined as desired to form further IC assemblies 150. The reference numeral "107" is omitted from FIGS. 8-12 for clarity of illustration, but example arrangements of OCMs 109 (part of ESDP structures 107, as discussed herein) in the IC assemblies 150 of FIGS. 8-12 are shown.

Figure 8:
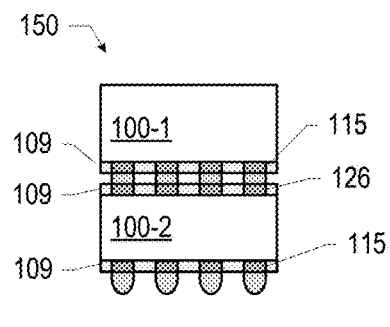
FIGS. 8-12 are side, cross-sectional views of example IC assemblies including ESDP structures, in accordance with various embodiments.

FIG. 8 illustrates an IC assembly 150 including a single-sided IC structure 100-1 coupled to a double-sided IC structure 100-2 (e.g., by solder). In some embodiments, the IC structure 100-1 of FIG. 8 may be the IC structures 100 of FIG. 2, 5, or 6, and the IC structure 100-2 of FIG. 8 may be the IC structures 100 of FIG. 1, 3, or 4. As noted above, in some embodiments, the IC structure 100-1 may include ESDP structures 107 while the IC structure 100-2 does not include ESDP structures 107 (or vice versa). In some embodiments, the IC structure 100-2 may be referred to as an "interposer"; if the IC structure 100-2 includes a device layer 106 (or otherwise includes active devices, such as transistors), the IC structure 100-2 may be referred to as an "active interposer," and if the IC structure 100-2 does not include a device layer 106 (or otherwise does not include active devices), the IC structure 100-2 may be referred to as a "passive interposer." In some embodiments, an IC structure 100 that does not include any ESDP structures 107 may instead include diodes for ESDP purposes, or may not include such diodes. Although FIG. 8 illustrates a single IC structure 100-1 coupled to the IC structure 100-2, multiple IC structures 100-1 may be coupled to the IC structure 100-2, as desired.

Figure 9:
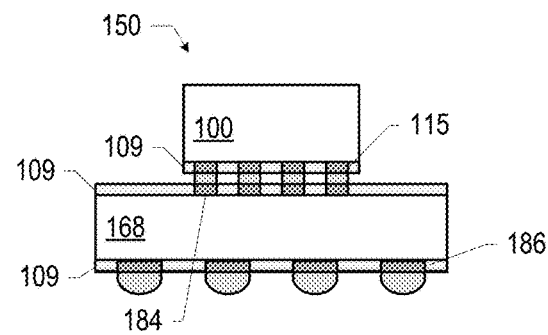

FIG. 9 illustrates an IC assembly 150 including a single-sided IC structure 100 coupled to an IC package support 168 (e.g., by solder). In some embodiments, the IC structure 100 of FIG. 9 may be the IC structures 100 of FIG. 2, 5, or 6; in other embodiments, the IC structure 100 of the IC assembly 150 of FIG. 9 may be a double-sided IC structure 100-1 (e.g., the IC structure 100 of FIG. 1, 3, or 4) and further IC structures (not shown) may be coupled "on top" of the IC structure 100. As noted above, in some embodiments, the IC structure 100 may include ESDP structures 107 while the IC package support 168 does not include ESDP structures 107 (or vice versa). In some embodiments, the IC package support 168 of FIG. 9 may be referred to as a "package substrate," and the IC assembly 150 may be referred to as an "IC package" and may in turn be coupled to a circuit board or other component. In some embodiments, the IC package support 168 of FIG. 9 may be an interposer between the IC structure 100 and another component (e.g., an IC structure 100 or an IC package support 168). Although FIG. 9 illustrates a single IC structure 100 coupled to the IC package support 168, multiple IC structures 100 may be coupled to the IC package support 168, as desired.

Figure 10:
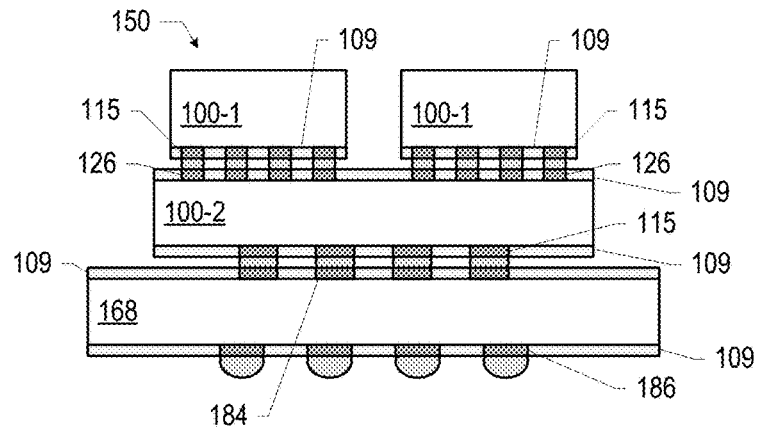

FIG. 10 illustrates an IC assembly 150 including single-sided IC structures 100-1 coupled to a double-sided IC structure 100-2 (e.g., by solder). The double-sided IC structure 100-2 is also coupled to an IC package support 168 (e.g., by solder). In some embodiments, the IC structures 100-1 of FIG. 10 may be the IC structures 100 of FIG. 2, 5, or 6; in other embodiments, the IC structures 100-1 of the IC assembly 150 of FIG. 10 may be double-sided IC structures 100-1 (e.g., the IC structure 100 of FIG. 1, 3, or 4) and further IC structures (not shown) may be coupled "on top" of the IC structures 100-1. In some embodiments, the IC structure 100-2 may be the IC structures 100 of FIG. 1, 3, or 4. As noted above, in some embodiments, one or more of the IC structures 100 may include ESDP structures 107 while the IC package support 168 does not include ESDP structures 107 (or vice versa). In some embodiments, the IC structure 100-2 of FIG. 10 may be referred to as an interposer (e.g., as discussed above with reference to FIG. 8), while the IC package support 168 may be referred to as a package substrate. In some embodiments, the IC assembly 150 may include an IC package support 168 in the place of the IC structure 100-2, instead of the IC structure 100-2.

Figure 11:
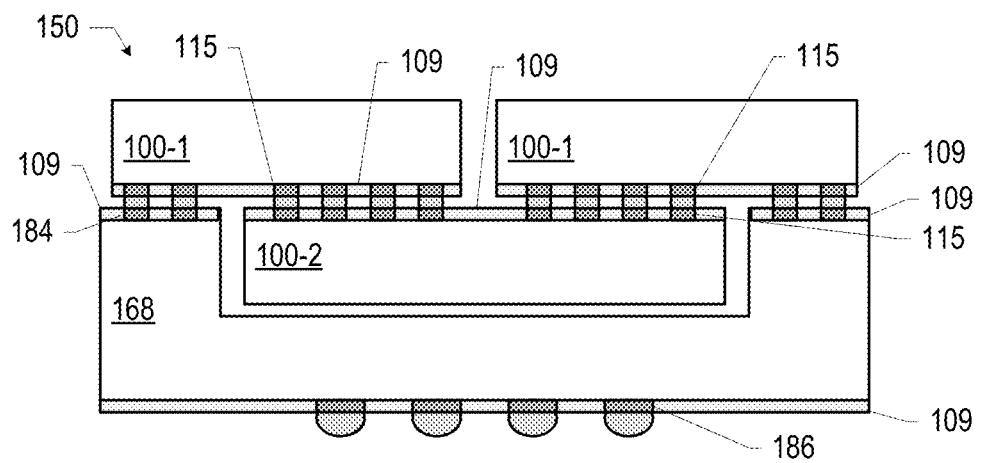

FIG. 11 illustrates an IC assembly 150 including single-sided IC structures 100-1 coupled to another single-sided IC structure 100-2 (e.g., by solder) and also to an IC package support 168 (e.g., by solder). In the IC assembly 150 of FIG. 11, the IC structure 100-2 may be referred to as a "bridge" (e.g., an "embedded bridge" due to the disposition of the IC structure 100-2 in a cavity of the IC package support 168). In some embodiments, the IC structures 100 of FIG. 11 may be the IC structures 100 of FIG. 2, 5, or 6. As noted above, in some embodiments, one or more of the IC structures 100 may include ESDP structures 107 while the IC package support 168 does not include ESDP structures 107 (or vice versa).

Figure 12:
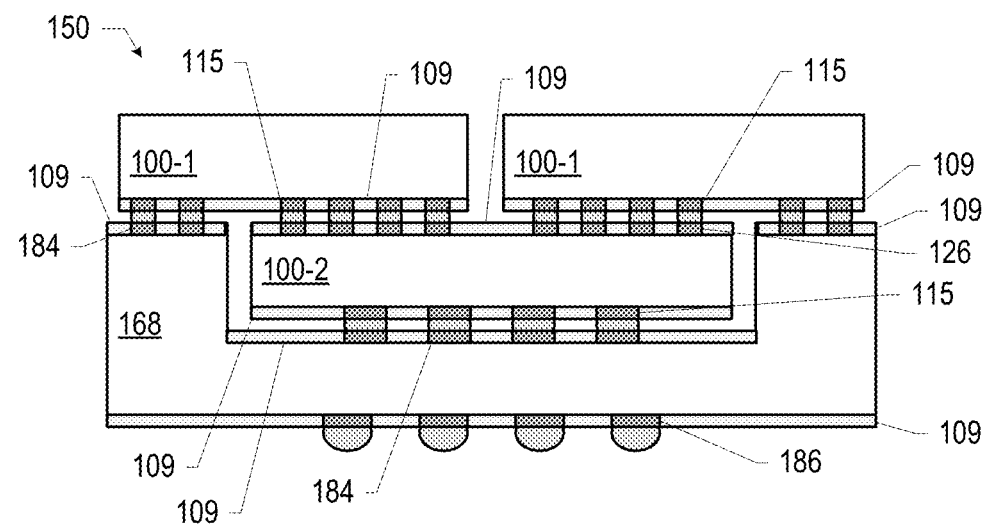

FIG. 12 illustrates an IC assembly 150 similar to the IC assembly 150 of FIG. 11 but in which the IC structure 100-2 is a double-sided IC structure (e.g., the IC structure 100 of FIG. 1, 3, or 4) and is also coupled to the IC package support 168 (e.g., by solder). In such an arrangement, the IC structure 100-2 may be a double-sided bridge.

Figure 13:
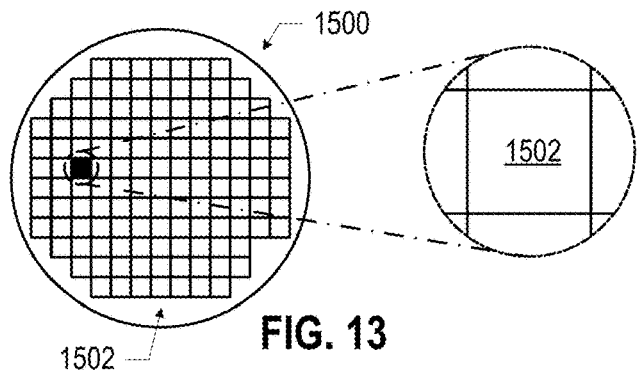
FIG. 13 is a top view of a wafer and dies that may include IC structures, in accordance with any of the embodiments disclosed herein.
Figure 14:
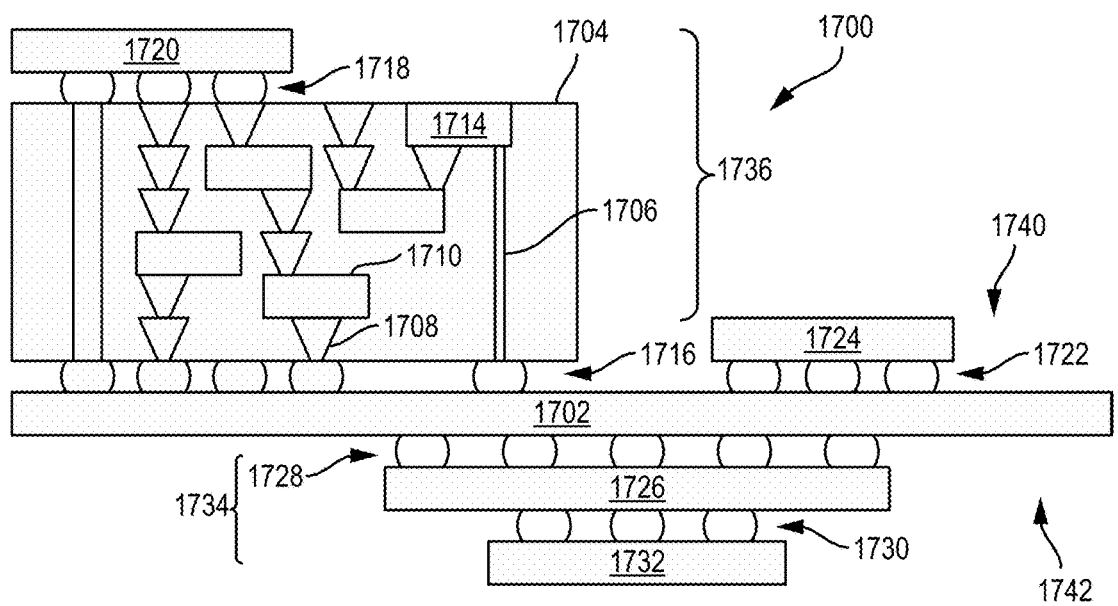
FIG. 14 is a side, cross-sectional view of an IC device assembly that may include IC structures, IC assemblies, IC package supports, and/or ESDP structures, in accordance with any of the embodiments disclosed herein.
Figure 15:
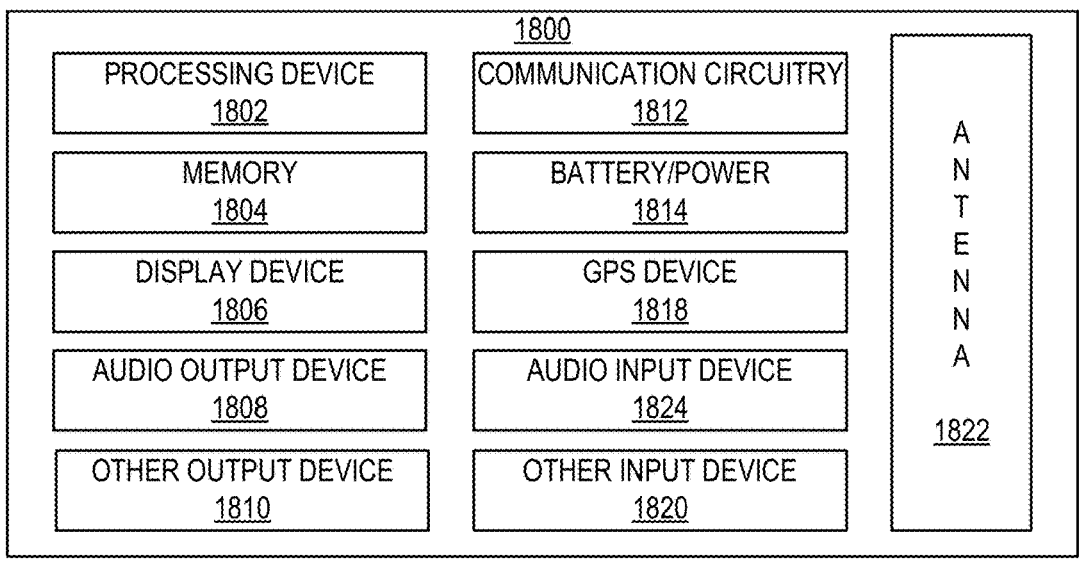
FIG. 15 is a block diagram of an example electrical device that may include IC structures, IC assemblies, IC package supports, and/or ESDP structures, in accordance with any of the embodiments disclosed herein.

The IC structures 100, IC assemblies 150, IC package supports 168, and/or ESDP structures 107 disclosed herein may include, or may be included in, any suitable electronic component. FIGS. 13-15 illustrate various examples of apparatuses that may include, or be included in, any of the IC structures 100, IC assemblies 150, IC package supports 168, and/or ESDP structures 107 disclosed herein, as appropriate.

FIG. 13 is a top view of a wafer 1500 and dies 1502 that may include one or more IC structures 100, or may be included in any suitable ones of the IC assemblies 150, IC package supports 168, and/or ESDP structures 107 disclosed herein. The wafer 1500 may be composed of a material (e.g., a semiconductor material) and may include one or more dies 1502 having structures formed on a surface of the wafer 1500. Each of the dies 1502 may be a repeating unit of a product that includes any suitable circuitry. After the fabrication of the product is complete, the wafer 1500 may undergo a singulation process in which the dies 1502 are separated from one another to provide discrete "chips" of the semiconductor product. In some embodiments, the die 1502 may include any of the IC structures 100 disclosed herein (e.g., the material of the wafer 1500 may be part of the substrate 102). In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 15) or other logic that is configured to store information in the memory devices or execute instructions stored in the memory array.

FIG. 14 is a side, cross-sectional view of an IC device assembly 1700 that may include any of the IC structures 100, IC assemblies 150, IC package supports 168, and/or ESDP structures 107 disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the IC assemblies 150, IC package supports 168, and/or ESDP structures 107 disclosed herein.

In some embodiments, the circuit board 1702 may be a PCB including multiple metal layers separated from one another by layers of organic dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 14 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 14), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 14, multiple IC packages may be coupled to the package interposer 1704; indeed, additional interposers may be coupled to the package interposer 1704. The package interposer 1704 may provide an intervening substrate used to bridge the circuit board 1702 and the IC package 1720. Generally, the package interposer 1704 may spread a connection to a wider pitch or reroute a connection to a different connection. For example, the package interposer 1704 may couple the IC package 1720 to a set of BGA conductive contacts of the coupling components 1716 for coupling to the circuit board 1702. In the embodiment illustrated in FIG. 14, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers (PAs), power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 14 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

FIG. 15 is a block diagram of an example electrical device 1800 that may include one or more IC structures 100, IC assemblies 150, IC package supports 168, and/or ESDP structures 107, in accordance with any of the embodiments disclosed herein. For example, any suitable ones of the components of the electrical device 1800 may include one or more of the IC device assemblies 1700 or dies 1502 disclosed herein. A number of components are illustrated in FIG. 15 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 15, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include communication circuitry 1812. For example, the communication circuitry 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication circuitry 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication circuitry 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication circuitry 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication circuitry 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication circuitry 1812 may operate in accordance with other wireless protocols in other embodiments. The electrical device 1800 may include an antenna 1822 to facilitate wireless communications and/or to receive other wireless communications (such as AM or FM radio transmissions). The communication circuitry 1812 may include any of the IC structures 100, IC assemblies 150, IC package supports 168, and/or ESDP structures 107 disclosed herein.

In some embodiments, the communication circuitry 1812 may manage wired communications, such as electrical, optical, or any other suitable communication protocols (e.g., the Ethernet). As noted above, the communication circuitry 1812 may include multiple communication chips. For instance, a first communication circuitry 1812 may be dedicated to shorter-range wireless communications such as Wi-Fi or Bluetooth, and a second communication circuitry 1812 may be dedicated to longer-range wireless communications such as global positioning system (GPS), EDGE, GPRS, CDMA, WiMAX, LTE, EV-DO, or others. In some embodiments, a first communication circuitry 1812 may be dedicated to wireless communications, and a second communication circuitry 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) component, including: a first conductive structure; a second conductive structure; and a material in contact with the first conductive structure and the second conductive structure, wherein the material has a first electrical conductivity before illumination of the material with optical radiation and a second electrical conductivity, different from the first electrical conductivity, after illumination of the material with optical radiation.

Example 2 includes the subject matter of Example 1, and further specifies that the material includes a polymer.

Example 3 includes the subject matter of any of Examples 1-2, and further specifies that the material includes poly(3,4-ethylenedioxythiophene) polystyrene sulfonate.

Example 4 includes the subject matter of any of Examples 1-3, and further specifies that the material is a first material, and the IC component further includes: a second material, different from the first material, wherein the second material is between the first material and a face of the IC component.

Example 5 includes the subject matter of Example 4, and further specifies that the second material includes silicon.

Example 6 includes the subject matter of Example 5, and further specifies that the second material further includes oxygen.

Example 7 includes the subject matter of any of Examples 1-6, and further specifies that the first conductive structure includes a conductive contact, the second conductive structure includes a conductive contact, and the material is in contact with the conductive contacts.

Example 8 includes the subject matter of any of Examples 1-7, and further specifies that the material is at a face of the IC component.

Example 9 includes the subject matter of any of Examples 1-8, and further specifies that the material is at a side face of the IC component.

Example 10 includes the subject matter of any of Examples 1-9, and further specifies that the material is in contact with all conductive contacts at a face of the IC component.

Example 11 includes the subject matter of any of Examples 1-9, and further specifies that the material is in contact with some, but not all, conductive contacts at a face of the IC component.

Example 12 includes the subject matter of any of Examples 1-11, and further specifies that the IC component includes a die.

Example 13 includes the subject matter of any of Examples 1-12, and further specifies that the IC component includes an interposer.

Example 14 includes the subject matter of any of Examples 1-13, and further specifies that the IC component includes a bridge.

Example 15 includes the subject matter of any of Examples 1-14, and further specifies that the IC component includes a package substrate.

Example 16 includes the subject matter of any of Examples 1-15, and further specifies that the IC component includes a cable.

Example 17 includes the subject matter of any of Examples 1-16, and further specifies that the first conductive structure is a ground conductive structure and the second conductive structure is a signal conductive structure.

Example 18 is an integrated circuit (IC) package, including: a die; and an IC package support coupled to the die, wherein the IC package support includes a polymer material, and the polymer material includes sulfur.

Example 19 includes the subject matter of Example 18, and further specifies that the die is coupled to the IC package support by solder.

Example 20 includes the subject matter of any of Examples 18-19, and further specifies that the die includes a diode.

Example 21 includes the subject matter of any of Examples 18-20, and further includes: a diode coupled to the IC package support.

Example 22 includes the subject matter of any of Examples 18-20, and further specifies that the polymer material has optically controlled electrical conductivity.

Example 23 includes the subject matter of any of Examples 18-22, and further specifies that the polymer material includes two different ionomers.

Example 24 includes the subject matter of any of Examples 18-23, and further specifies that the polymer material includes poly(3,4-ethylenedioxythiophene) polystyrene sulfonate.

Example 25 includes the subject matter of any of Examples 18-24, and further specifies that the IC package support further includes: a material between the polymer material and a face of the IC package support, wherein the material is different from the polymer material.

Example 26 includes the subject matter of Example 25, and further specifies that the material includes silicon.

Example 27 includes the subject matter of Example 26, and further specifies that the material further includes oxygen.

Example 28 includes the subject matter of any of Examples 18-27, and further specifies that the IC package support includes a first conductive structure and a second conductive structure, and the polymer material is in contact with the first conductive structure and the second conductive structure.

Example 29 includes the subject matter of Example 28, and further specifies that the first conductive structure is a ground conductive structure and the second conductive structure is a signal conductive structure.

Example 30 includes the subject matter of any of Examples 28-29, and further specifies that the first conductive structure includes a conductive contact, the second conductive structure includes a conductive contact, and the polymer material is in contact with the conductive contacts.

Example 31 includes the subject matter of any of Examples 18-30, and further specifies that the polymer material is at a face of the IC package support.

Example 32 includes the subject matter of any of Examples 18-31, and further specifies that the polymer material is at a side face of the IC package support.

Example 33 includes the subject matter of any of Examples 18-32, and further specifies that the polymer material is in contact with all conductive contacts at a face of the IC package support.

Example 34 includes the subject matter of any of Examples 18-32, and further specifies that the polymer material is in contact with some, but not all, conductive contacts at a face of the IC package support.

Example 35 includes the subject matter of any of Examples 18-34, and further specifies that the IC package support includes an interposer.

Example 36 includes the subject matter of any of Examples 18-35, and further specifies that the IC package support includes a bridge.

Example 37 includes the subject matter of any of Examples 18-36, and further specifies that the IC package support includes a package substrate.

Example 38 is a computing device, including: an integrated circuit (IC) component including a material, wherein the material has optically controlled electrical conductivity; and a circuit board electrically coupled to the IC component.

Example 39 includes the subject matter of Example 38, and further specifies that the material includes a polymer.

Example 40 includes the subject matter of any of Examples 38-39, and further specifies that the material includes poly(3,4-ethylenedioxythiophene) polystyrene sulfonate.

Example 41 includes the subject matter of any of Examples 38-40, and further specifies that the material is a first material, and the IC component further includes: a second material, different from the first material, wherein the second material is between the first material and a face of the IC component.

Example 42 includes the subject matter of Example 41, and further specifies that the second material includes silicon.

Example 43 includes the subject matter of any of Examples 38-42, and further specifies that the IC component includes a first conductive structure and a second conductive structure, and the material is in contact with the first conductive structure and the second conductive structure.

Example 44 includes the subject matter of Example 43, and further specifies that the first conductive structure includes a conductive contact, the second conductive structure includes a conductive contact, and the material is in contact with the conductive contacts.

Example 45 includes the subject matter of any of Examples 43-44, and further specifies that the first conductive structure is a ground conductive structure and the second conductive structure is a signal conductive structure.

Example 46 includes the subject matter of any of Examples 38-45, and further specifies that the material is at a face of the IC component.

Example 47 includes the subject matter of any of Examples 38-46, and further specifies that the material is at a side face of the IC component.

Example 48 includes the subject matter of any of Examples 38-47, and further specifies that the material is in contact with all conductive contacts at a face of the IC component.

Example 49 includes the subject matter of any of Examples 38-47, and further specifies that the material is in contact with some, but not all, conductive contacts at a face of the IC component.

Example 50 includes the subject matter of any of Examples 38-49, and further specifies that the IC component includes a die.

Example 51 includes the subject matter of any of Examples 38-50, and further specifies that the IC component includes an interposer.

Example 52 includes the subject matter of any of Examples 38-51, and further specifies that the IC component includes a bridge.

Example 53 includes the subject matter of any of Examples 38-52, and further specifies that the IC component includes a package substrate.

Example 54 includes the subject matter of any of Examples 38-53, and further specifies that the IC component includes a cable.

Example 55 includes the subject matter of any of Examples 38-54, and further specifies that the IC component includes a die coupled to an IC package support, and the material is included in the die or in the IC package support.

Example 56 includes the subject matter of Example 55, and further specifies that the material is included in the IC package support.

Example 57 includes the subject matter of any of Examples 55-56, and further specifies that the die is coupled to the IC package support by solder.

Example 58 includes the subject matter of any of Examples 56-57, and further specifies that the die includes a diode.

Example 59 includes the subject matter of any of Examples 55-58, and further specifies that the IC component further includes a diode coupled to the IC package support.

Example 60 includes the subject matter of any of Examples 55-59, and further specifies that the IC package support further includes an organic dielectric material.

Example 61 includes the subject matter of any of Examples 38-60, and further specifies that the circuit board is a motherboard.

Example 62 includes the subject matter of any of Examples 38-61, and further includes: an antenna electrically coupled to the circuit board.

Example 63 includes the subject matter of any of Examples 38-62, and further includes: a display device electrically coupled to the circuit board.

Example 64 includes the subject matter of any of Examples 38-63, and further specifies that the computing device is a handheld computing device.

Example 65 includes the subject matter of any of Examples 38-63, and further specifies that the computing device is a wearable computing device.

Example 66 includes the subject matter of any of Examples 38-63, and further specifies that the computing device is a server computing device.

The invention claimed is:

1. An integrated circuit (IC) component, comprising:
   a first conductive structure electrically coupled to a ground connection;
   a second conductive structure electrically coupled to a signal connection; and
   a material in contact with the first conductive structure and the second conductive structure, wherein:
      the material has a first electrical conductivity before illumination of the material with optical radiation, and a second electrical conductivity, different from the first electrical conductivity, after illumination of the material with optical radiation,
      the first electrical conductivity is such that the material electrically insulates the first conductive structure from the second conductive structure, and
      the second electricity conductivity is such that the material shorts the first conductive structure and the second conductive structure between the signal connection and the ground connection.

2. The IC component of claim 1, wherein the material includes a polymer.

3. The IC component of claim 1, wherein the material includes poly(3,4-ethylenedioxythiophene) polystyrene sulfonate.

4. The IC component of claim 1, wherein the material is a first material, and the IC component further includes:
   a second material, different from the first material, wherein the second material is between the first material and a face of the IC component.

5. The IC component of claim 1, wherein the IC component includes a die, an interposer, a bridge, a package substrate, or a cable.

6. The IC component of claim 1, wherein the first conductive structure is a ground conductive structure and the second conductive structure is a signal conductive structure.

7. An integrated circuit (IC) package, comprising:
   a die; and
   an IC package support coupled to the die, wherein:
      the IC package support includes a electrostatic discharge protection (ESDP) structure comprising a polymer material,
      the polymer material includes sulfur,
      the polymer material has optically controlled electrical conductivity, such that the polymer material is a conductor in a first state and an insulator in a second state,
      the polymer material is maintained in the first state when ESDP is provided by the ESDP structure, and
      the polymer material is maintained in the second state when ESDP is not provided by the ESDP structure.

8. The IC package of claim 7, wherein the die is coupled to the IC package support by solder.

9. The IC package of claim 7, wherein the polymer material has optically controlled electrical conductivity.

10. The IC package of claim 7, wherein the polymer material includes two different ionomers.

11. The IC package of claim 7, wherein the polymer material is at a face of the IC package support.

12. The IC package of claim 7, wherein the polymer material is at a side face of the IC package support.

13. The IC package of claim 7, wherein the polymer material is in contact with all conductive contacts at a face of the IC package support.

14. The IC package of claim 7, wherein the polymer material is in contact with some, but not all, conductive contacts at a face of the IC package support.

15. A computing device, comprising:
   an integrated circuit (IC) component including a first material and a second material; and
   a circuit board electrically coupled to the IC component, wherein:
      the first material has a first state in which the first material is an electrical conductor,
      the first material has a second state in which the first material is an electrical insulator,
      the first material switches between the first state and the second state upon illumination by optical radiation,
      the second material coats the first material, and
      the second material is transparent to the optical radiation.

16. The computing device of claim 15, wherein the IC component includes a first conductive structure and a second conductive structure, and the first material is in contact with the first conductive structure and the second conductive structure.

17. The computing device of claim 15, wherein the IC component includes a die coupled to an IC package support, and the first material is included in the die or in the IC package support.

18. The computing device of claim 17, wherein the first material is included in the IC package support.

19. The computing device of claim 17, wherein the IC package support further includes an organic dielectric material.

20. The computing device of claim 15, wherein the computing device is a handheld computing device, a wearable computing device, or a server computing device.

* * * * *